United States Patent
Sohda et al.

(10) Patent No.: US 7,098,464 B2
(45) Date of Patent: Aug. 29, 2006

(54) ELECTRON BEAM WRITING EQUIPMENT AND ELECTRON BEAM WRITING METHOD

(75) Inventors: Yasunari Sohda, Kawasaki (JP); Osamu Kamimura, Kokubunji (JP); Yoshinori Nakayama, Sayama (JP); Sayaka Tanimoto, Kodaira (JP); Masato Muraki, Tokyo (JP)

(73) Assignees: Hitachi High-Technologies Corporation, Tokyo (JP); Canon Kabushiki Kaisha, Tokyo (JP)

( * ) Notice: Subject to any disclaimer, the term of this patent is extended or adjusted under 35 U.S.C. 154(b) by 200 days.

(21) Appl. No.: 10/957,695

(22) Filed: Oct. 5, 2004

(65) Prior Publication Data

US 2005/0072939 A1 Apr. 7, 2005

(30) Foreign Application Priority Data

Oct. 7, 2003 (JP) ............................. 2003-348019

(51) Int. Cl.
*H01J 37/304* (2006.01)
(52) U.S. Cl. ............................. 250/491.1; 250/492.22; 250/492.23
(58) Field of Classification Search ................ None
See application file for complete search history.

(56) References Cited

U.S. PATENT DOCUMENTS 5,168,166 A * 12/1992 Hayakawa et al. ...... 250/492.2
6,762,421 B1 * 7/2004 Nakasugi ................. 250/491.1
2006/0108541 A1 * 5/2006 Koike ...................... 250/491.1

FOREIGN PATENT DOCUMENTS

| JP | 1-214117 | 2/1988 |
| JP | 6-275500 | 3/1993 |
| JP | 9-22676 | 7/1995 |

\* cited by examiner

*Primary Examiner*—Jack I. Berman
(74) *Attorney, Agent, or Firm*—Reed Smith LLP; Stanley P. Fisher, Esq.; Juan Carlos A. Marquez, Esq.

(57) ABSTRACT

The present invention provides a writing technique which can perform high-accuracy overlay writing in electron beam writing equipment performing mark detection by light.

Electron beam writing equipment has an electron source; an electron optical system illuminating an electron beam emitted from the electron source onto a sample for scanning to form a desired pattern on the sample; a stage mounting the sample; a mark substrate provided on the stage; means beaming a light beam for position detection which is on the same side as the illumination direction of the electron beam for illuminating the mark substrate; light detection means which is on the same side as the means beaming a light beam for detecting reflected light reflected on the mark substrate; and electron detection means which is on the side opposite the light detection means with respect to the mark substrate for detecting a transmitted electron obtained by illumination of the electron beam onto the mark substrate, wherein relative position information of the light beam and the electron beam is obtained based on the signals of the detected reflected light and transmitted electron.

30 Claims, 5 Drawing Sheets

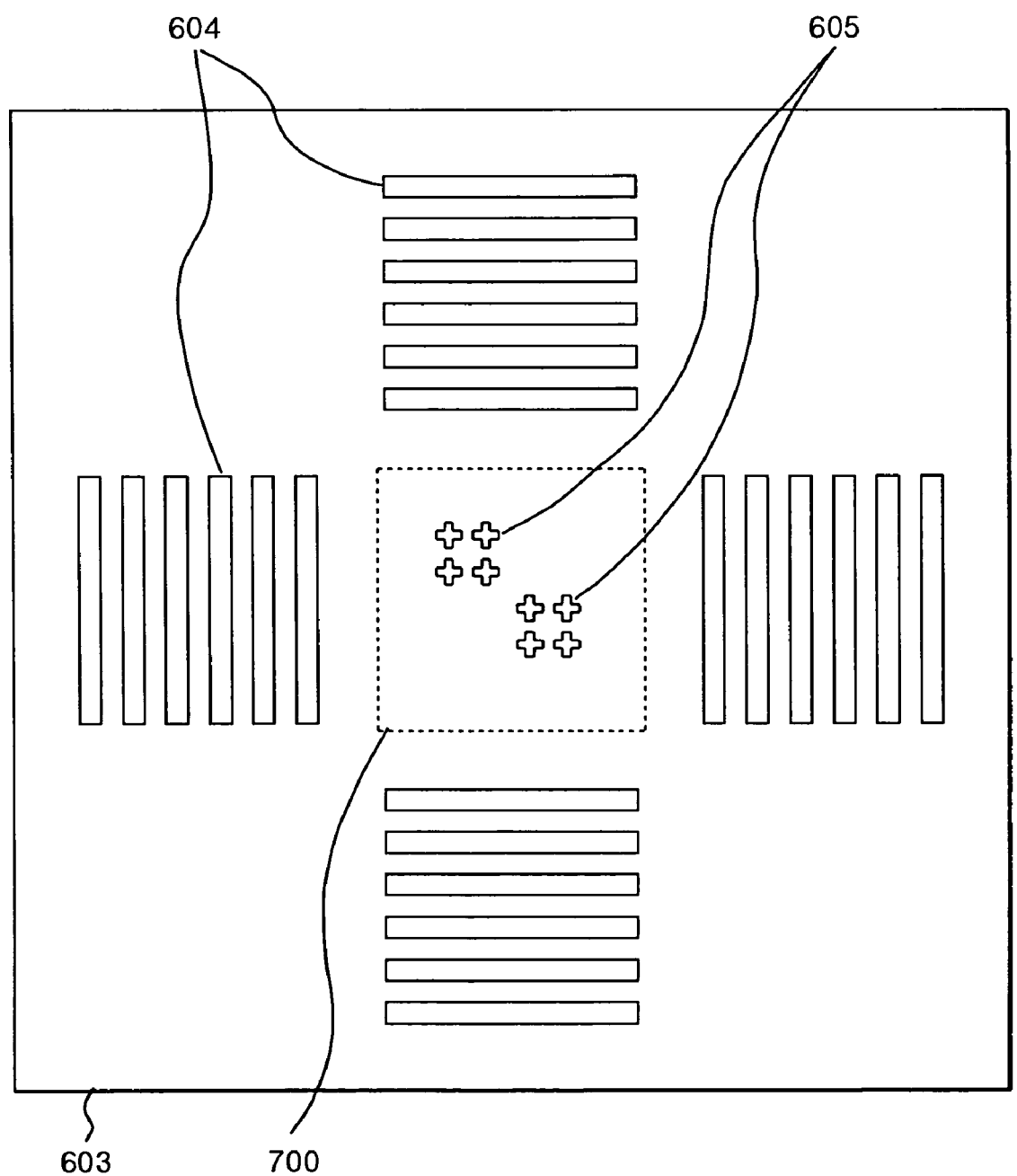

ELECTRON BEAM WRITING EQUIPMENT AND ELECTRON BEAM WRITING METHOD

CLAIM OF PRIORITY

The present invention claims priority from Japanese application JP 2003-348019 field on Oct. 7, 2003, the content of which is hereby incorporated by reference on to this application.

BACKGROUND OF THE INVENTION

The present invention relates to a lithography technique. More specifically, the present invention relates to an electron beam writing technique used in a semiconductor process.

Electron beam measuring equipment which detects a wafer position by light to measure it by electron beam is proposed. In Japanese Patent Application Laid-Open No. 9-22676, mark positions are detected by light and electron beam to identify the distance between both, thereby feeding back a mark detected value by the light to position control of the electron beam.

In Japanese Patent Application Laid-Open No. 1-214117, a method of detecting a wafer position by light to perform writing by electron beam is proposed.

In Japanese Patent Application Laid-Open No. 6-275500, a method of measuring the focus and stigma of an electron beam by a transmitted electron which has transmitted through an aperture on a stage is proposed.

SUMMARY OF THE INVENTION

In the above-described prior art (Patent Document 1) method, both light and electron beam use reflected signals from marks are used, resulting in limited accuracy. In the prior art (Patent Document 2), detection is performed by a backscattered electron. In both of the prior art methods, it is hard to say that the accuracy of mark detection is sufficiently considered.

In the prior art (Patent Document 2), being effective for high-accuracy alignment of an electron beam, no consideration of alignment with a base wafer pattern at writing is given.

An object of the present invention is to provide an electron beam wiring technique which can perform high-accuracy overlay writing in mark detection using light.

To achieve the above object, electron beam writing equipment according to the present invention has on a stage a mark substrate illuminated by light beam for position detection and electron beam for writing from the same side and having a support and apertures; an electron detecting surface (here, the term of an electron beam receiving surface used in light is called a detecting surface) provided in the direction opposite the illumination side; and a light detecting surface provided in the same direction as the illumination side, thereby making measurement by the electron beam which is a transmitted beam excellent in efficiency and contrast and the light beam which is reflected light capable of being compatible with wafer mark detection.

In the above-described prior art (Patent Document 1), since the pattern on a sample by electron beam is measured by a backscattered electron or secondary electron, it is desirable that mark detection by electron beam be performed by a backscattered electron or secondary electron.

In the writing equipment of the present invention, mark detection by electron beam is performed by a transmitted electron, which cannot adversely affect the accuracy of the equipment. The mark detection by electron beam is performed in positions other than a sample position. A detector can be provided on the stage to use a transmitted electron. The detection method according to the present invention has been found by utilizing the characteristic of the writing equipment.

In the prior art method of using electron beam reflection, a substrate or its surface must be conductive. The reflection from the background is increased in detection by light to lower the contrast between the signals of reflected lights. Using a mark substrate having apertures can zero the reflectivity in the apertures. An effect for increasing the contrast between the signals of the reflected lights at the same time can be expected.

To use the present invention more effectively, the devising of a mark structure is important. For instance, the mark substrate is manufactured by coating a metal onto a light element support so as to achieve both high-accuracy aperture formation important for measurement by electron beam and mark reflection important for measurement by light. There is also a method of coating a metal having a principal atom with an atomic number higher than that of a principal atom constituting the support. This can increase the contrast in electron beam measurement while maintaining high-accuracy aperture formation. For instance, it is considered that a principal atom constituting the support is silicon excellent in processability and an element with a higher atomic number is a heavy metal or noble metal. In recent years, the technique for fabricating a stencil substrate having high-accuracy microfabrication pattern apertures withstanding position measurement has been advanced. This utilization is an aim of the present invention.

To improve the mark detection accuracy by light, it is desirable to increase the contrast. For instance, a member absorbing light for position detection is provided between the mark substrate and the electron detecting surface to prevent reflection of light from the underside of the mark substrate. The reflectivity of light which has transmitted through the aperture is significantly lowered to increase the contrast between reflected lights. This is a great advantage as compared with the case of using a thick substrate.

A mark for electron beam is isolated from a mark for light beam, which is significant. An optimum structure for the respective measurement can be provided. In this case, it is important to stabilize the relative distance between the two marks by arranging them to be close to each other. A method of arranging the mark for electron beam in the mark for light beam relatively increased is also advantageous for stabilizing the relative distance between the marks. When isolating the mark for electron beam from the mark for light beam, a light absorber is provided in the direction opposite the illumination side of the mark for light beam. It is effective to prevent light reflection from other than the mark substrate.

In the case of baseline correction in electron beam writing equipment of a multiple beam system forming a plurality of electron beams which can be subject to blanking independently, a mark detection substrate formed with a mark for detection by light having a pitch being substantially an integral multiple of the pitch of multiple beams can use both marks together. High-accuracy correction can be expected.

The representative configuration examples of the present invention will be described below.

(1) Electron beam writing equipment of the present invention has an electron source; an electron optical system illuminating an electron beam emitted from the electron source onto a sample for scanning to form a desired pattern on the sample; a stage mounting the sample; a mark substrate provided on the stage; means beaming a light beam for position detection which is on the same side as the illumination direction of the electron beam for illuminating the mark substrate; light detection means which is on the same side as the means beaming a light beam for detecting reflected light reflected on the mark substrate; and electron detection means which is on the side opposite the light detection means with respect to the mark substrate for detecting a transmitted electron obtained by illumination of the electron beam onto the mark substrate, wherein relative position information of the light beam and the electron beam is obtained based on the signals of the detected reflected light and transmitted electron.

(2) Electron beam writing equipment of the present invention has an electron source; an electron optical system illuminating an electron beam emitted from the electron source onto a sample for scanning to write a desired pattern on the sample; a stage mounting the sample; a mark substrate provided on the stage; means beaming a light beam for position detection which is on the same side as the illumination direction of the electron beam for illuminating the mark substrate; light detection means which is on the same side as the means beaming a light beam for detecting reflected light reflected on the mark substrate; and electron detection means which is on the side opposite the light detection means with respect to the mark substrate for detecting a transmitted electron obtained by illumination of the electron beam onto the mark substrate, wherein relative position information of the light beam and the electron beam is obtained by using the signals of the detected reflected light and transmitted electron together.

(3) Electron beam writing equipment of the present invention has an electron optical system independently on/off controlling each of a plurality of electron beams arrayed with a predetermined pitch, deflecting and scanning the on/off controlled electron beams together, and writing a desired pattern on the sample; a stage mounting the sample; a stage mounting the sample; a mark substrate provided on the stage; means beaming a light beam for position detection which is on the same side as the illumination direction of the electron beam for illuminating the mark substrate; light detection means which is on the same side as the means beaming a light beam for detecting reflected light reflected on the mark substrate; and electron detection means which is on the side opposite the light detection means with respect to the mark substrate for detecting a transmitted electron obtained by illumination of the electron beam onto the mark substrate, wherein relative position information of the light beam and the electron beam is obtained based on the detected reflected light and transmitted electron.

(4) An electron beam writing method of the present invention has the steps of: illuminating and scanning an electron beam emitted from an electron source onto a sample mounted on a stage to form a desired pattern on the sample; illuminating a light beam for position detection onto a mark substrate provided on the stage from the same side as the illumination direction of the electron beam and detecting reflected light reflected on the mark substrate from the same side as the illumination direction of the light beam; illuminating the electron beam onto the mark substrate and detecting a transmitted electron which has transmitted though the mark substrate on the side opposite the side detecting the reflected light with respect to the mark substrate; and obtaining relative position information of the light beam and the electron beam based on the detected reflected light and transmitted electron, wherein a mark position on the sample is detected by the light beam to perform writing by the electron beam according to the obtained relative position information.

According to the present invention, high-accuracy overlay writing of the electron beam writing equipment can be performed to form a high-resolution device pattern. In particular, the present invention is considered to be effective for electron beam writing equipment of a multiple beam system.

BRIEF DESCRIPTION OF THE DRAWINGS

FIG. 7 is a top view of assistance in explaining the shapes of marks for electron beam and marks for light beam of the mark substrate according to Embodiment 3.

DETAILED DESCRIPTION OF THE PREFERRED EMBODIMENTS (Embodiment 1)

Figure 1:
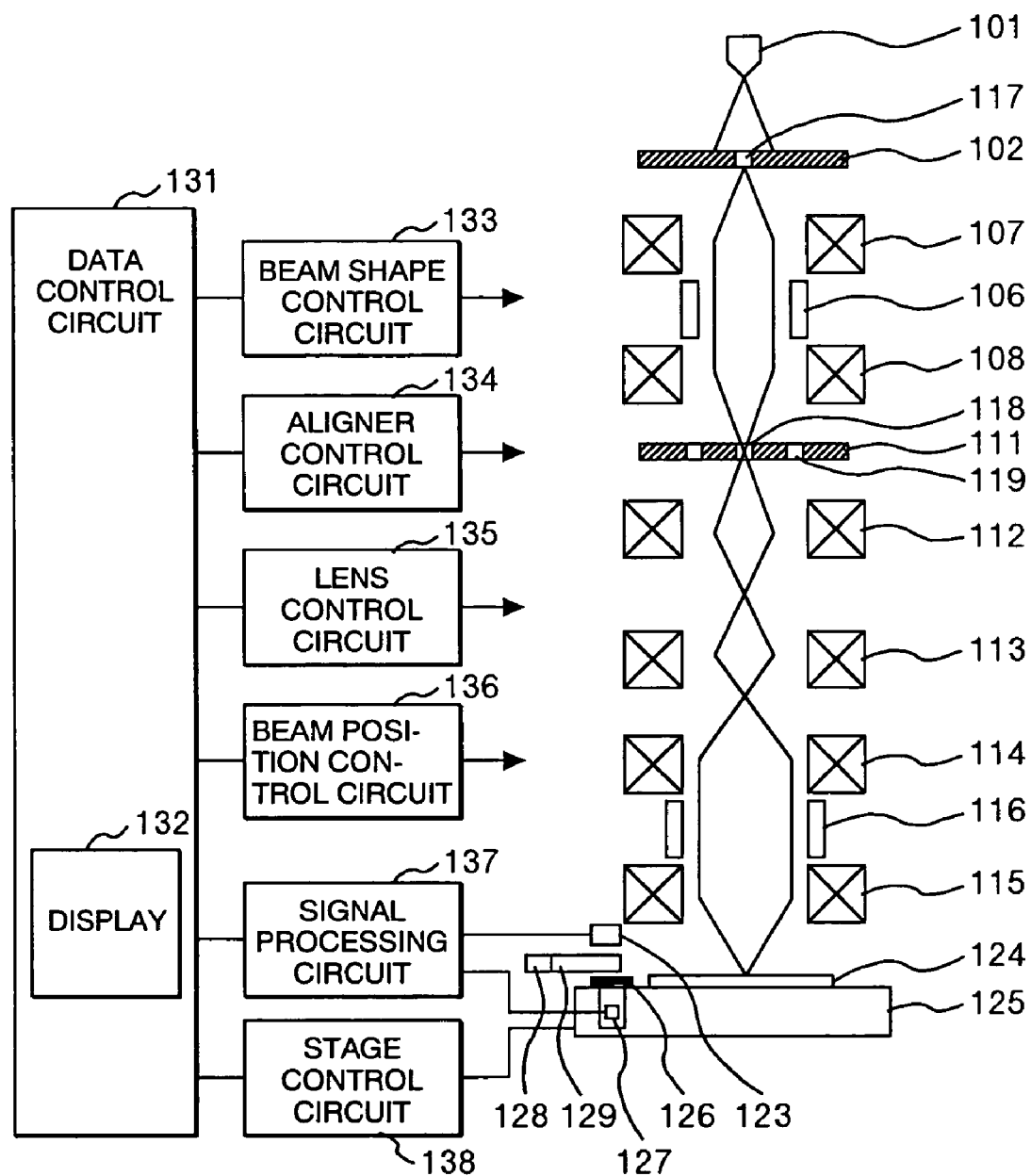
FIG. 1 is a schematic diagram of assistance in explaining the configuration of equipment according to Embodiments 1 and 2 of the present invention.

FIG. 1 shows the configuration of equipment according to this embodiment. In this embodiment, electron beam writing equipment which can use together a variable shaping method and a cell projection method together is targeted.

An electron beam accelerated to 50 kV by an electron source 101 illuminates a first mask 102 formed with a rectangular aperture 117. The image of the rectangular aperture is formed on a second mask 111 by two projection lenses 107 and 108. A rectangular aperture 118 for variable shaping and a plurality of cell apertures 119 for cell projection are formed on the second mask 111. The position of the first mask image on the second mask is controlled by a shaping deflector 106 and a beam shape control circuit 133 between the two masks. The transmitted electron beam formed by the two masks is demagnified by two demagnification lenses 112 and 113 to be finally projected onto a sample 124 placed on a stage 125 by objective lenses 114 and 115. These lenses are driven by a lens control circuit 135. At the same time, the electron beam is axis aligned by an aligner control circuit 134. The position of the electron beam on the sample 124 is controlled by an objective deflector 116.

A mark substrate 126 for position detection is provided on the stage 125. A laser interferometer, not shown, measuring the positions of the mark substrate 126 and the stage 125, a transmitted electron detector 127, a signal processing circuit 137 and a stage control circuit 138 are used to measure the position of the electron beam. The equipment has a reflected light detector 123 and a light source 128 in addition to the mark substrate 126 for position detection provided on the stage 125 and can measure the position of light. The entire control of these is performed by a data control circuit 131. The controlled result and the measured result are displayed by a display 132.

Figure 2:
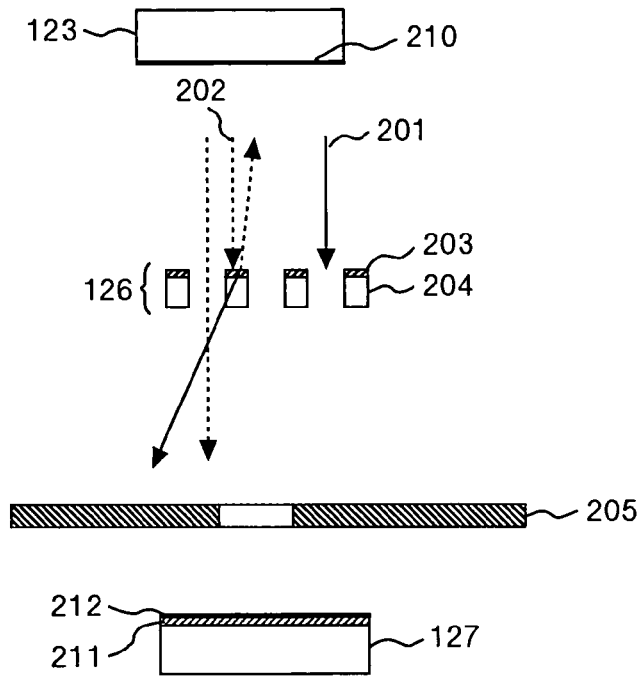
FIG. 2 is a diagram of assistance in explaining a mark peripheral portion according to Embodiment 1.

FIG. 2 shows an enlarged view around the mark substrate. An electron beam 201 used here is an electron beam for writing. A light beam 202 is light for wafer mark detection. Actually, the light and the electron are incident in different positions. For convenience of the description, they are shown in the same position. To simply show the drawing, the light source and the optical fiber are not shown in FIG. 2. The transmitted electron detector 127 and an electron detecting surface 211 are provided on the side opposite the plane in which the electron beam 201 is illuminated onto the mark substrate 206, enabling high sensitivity and high contrast. The reflected light detector 123 and a light detecting surface 210 are provided on the same side as the plane in which the light beam 202 is illuminated onto the mark substrate 126. This can detect reflected light from the wafer mark.

Using the transmitted electron and the reflected light together is found to be important for baseline correction of the equipment detecting a wafer mark by light to perform writing by electron beam. In particular, the amount of current per beam is smaller in a multiple beam system. Detection of a highly sensitive transmitted electron is essential.

In this embodiment, as shown in FIG. 2, a silicon stencil 204 is selected as a support. Its thickness is 2 µm. The reason why a light element is selected as the support is that it is excellent in processability of an aperture to make the accuracy of the aperture shape higher. As candidates of other materials, silicon carbide and diamond are considered. To facilitate the process, the silicon stencil 204 is a thin film having a thickness of 2 µm. This is ½ or below of the range of an electron beam used for writing. The silicon having a thickness of 2 µm cannot shut off the electron beam of 50 kV. It is 10 times or more larger than the mean free path and can scatter the electron beam. When an aperture for scattered electron 207 is provided such that no scattered electrons are incident upon the transmitted electron detector 127, high contrast can be obtained. The electron beam 201 which has transmitted through the aperture is directly incident upon the transmitted electron detector 127. High sensitivity can be obtained.

The aperture for scattered electron 207 is a light absorber. Specifically, it is a blackbody of carbon. This absorbs the light which has transmitted through the silicon so that no irregular reflected light around the detection part is incident upon the reflected light detector 123. There is also a method of manufacturing the aperture for scattered electron 207 using a material having good processability, such as aluminum, to coat its surface with the carbon. A light absorber 212 is arranged on the electron detecting surface, which is effective from the same reason.

In FIG. 2, gold (Au) 203 as a noble metal is deposited on the silicon. This can increase the reflectivity of light from the support. The substrate of a mark for electron beam and a mark for light beam can be shared. This is a great merit in ensuring the accuracy of baseline correction. Deposition of the gold having an atom with an atomic number higher than that of a principal atom constituting the support is effective for improving the scattering power to the electron beam. The double merit can be obtained. In FIG. 2, deposition of the gold is performed only from the upper surface. Since the function of reflecting light is important, the deposition may be performed from both surfaces or only from the lower surface. In other words, the gold may be coated at least on the surface on the side of means reflecting the light beam or on the opposite side. The thickness of the gold of this embodiment is 40 nm. This is twice or more the depth of penetration of the light used for detection. This can obtain a sufficient reflectivity. When the film thickness is larger than the size of the aperture pattern, it adversely affects the aperture pattern shape. Examples of other candidates of noble metal or heavy metal coated can include platinum, palladium, tungsten and tantalum. An alloy of these may be used. To form a two-layer film, there are a method of depositing a noble metal film after fabricating an aperture in a silicon substrate and a method of forming an aperture after fabricating a heavy metal film in a silicon substrate by the CVD method. The aperture shape has a 1-µm line with a 2-µm pitch.

The wavelength of the light for mark detection is 590 nm. It is incident almost vertically upon the mark substrate 126 through an optical fiber 129 shown in FIG. 1. The reflectivity of the light in a certain portion of the support is 90% or above, which is significantly contrasted with 0% of the aperture. The detection probability of the electron beam scattered in a certain portion of the support is 1% or below. It is found that signals in almost ideal contrast in both beams can be obtained.

Figure 3:
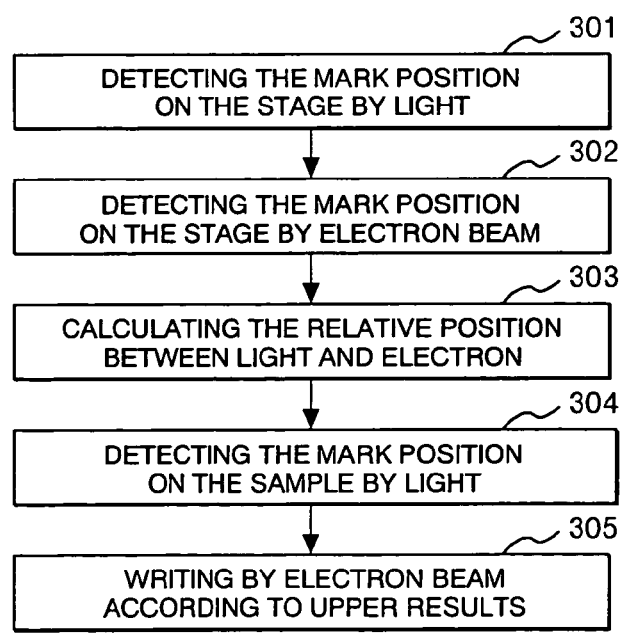
FIG. 3 is a diagram of assistance in explaining a process for performing overlay writing according to the present invention.

The above equipment is used to perform overlay writing to a silicon wafer according to the process of FIG. 3. The mark positions shown in FIG. 2 are detected by light and electron beam (steps 301 and 302) to obtain relative position information of both (step 303). In this case, the light source 128, the reflected light detector 123, the signal processing circuit 137 and the stage control circuit 138 are utilized. Mark detection of the wafer is performed by light (step 304) to detect the pattern position of the base layer. The obtained relative position information is processed by the data control circuit 131 to be finally fed back to the objective deflector 116 for performing writing by electron beam (step 305). As a result, an alignment accuracy of 30 nm can be realized by 3σ.

As is apparent from the above description, the transmitted electron is larger in the aperture and the reflected light is larger other than the aperture. Using the reverse phase can perform high-speed baseline correction. Both signals of the transmitted electron and the reflected light are synthesized with each other. The relative distance between the light and the electron in which the contrast is lowest is obtained, making it possible to perform correction. This method is one application method of the present invention.

(Embodiment 2)

Figure 4:
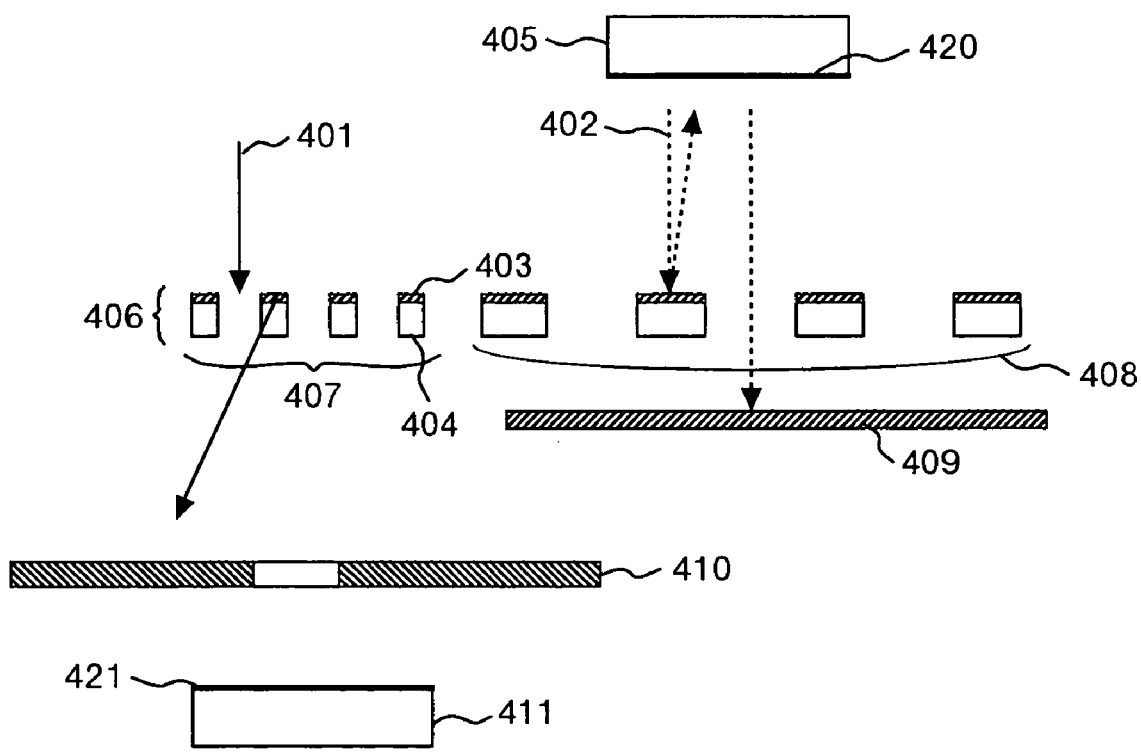
FIG. 4 is a diagram of assistance in explaining a mark peripheral portion according to Embodiment 2.

In this embodiment, equipment equivalent to that of FIG. 1 is used and the mark detection part shown in FIG. 4 is used. In FIG. 4, a mark for electron beam 407 is isolated from a mark for light beam 408. This is done to increase the accuracy by using a mark pattern suitable for the respective marks. Since the relative distance between the marks must be stable to heat and stress, both must be positioned as close as possible to each other. In this embodiment, as a mark substrate, aluminum (Al) 403 as a metal having a thickness of 100 nm is deposited on a silicon stencil 404 having a thickness of 5 µm. The electron beam scattering power of the aluminum is not very different from that of the silicon. An effect for increasing the reflectivity of the light can be expected.

In general, an electron beam 401 is hard to be deflected largely so that a small mark is preferable. A light beam 402 for mark detection has poor resolution so that a large mark is preferable. The mark for light beam 408 is larger than the mark for electron beam 407. In FIG. 4, the mark for light beam 408 having a 4-µm line with a 20-µm pitch is formed following the aperture shape having 1-μm line with a 2-μm pitch of the mark for electron beam 407. A light absorber 409 is provided under the mark for light beam 408 to prevent irregular reflection of light. The light absorber 409 is desirably a conductor to prevent electrification due to the electron beam transmitting through therenear. Carbon is used as the light absorber.

In addition to simply lowering the reflectivity of the material, there is a method of lowering the reflectivity of light by a convex and concave structure. The mark for light beam is detected by light beam and the mark for electron beam is detected by electron beam. The relative relation between the electron beam and the light beam is obtained by taking into account the distance between both patterns. Mark detection of the wafer is performed by the light to detect the pattern position of the base layer for performing writing by the electron beam according to the obtained relative position information. As a result, an alignment accuracy of 25 nm can be realized by 3σ.

In the drawing, the numeral 405 denotes a light detector; 406, a mark substrate; 410, an aperture for scattered electron; 411, an electron detector; 420, a light detecting surface; and 421, an electron detecting surface.

(Embodiment 3)

Figure 5:
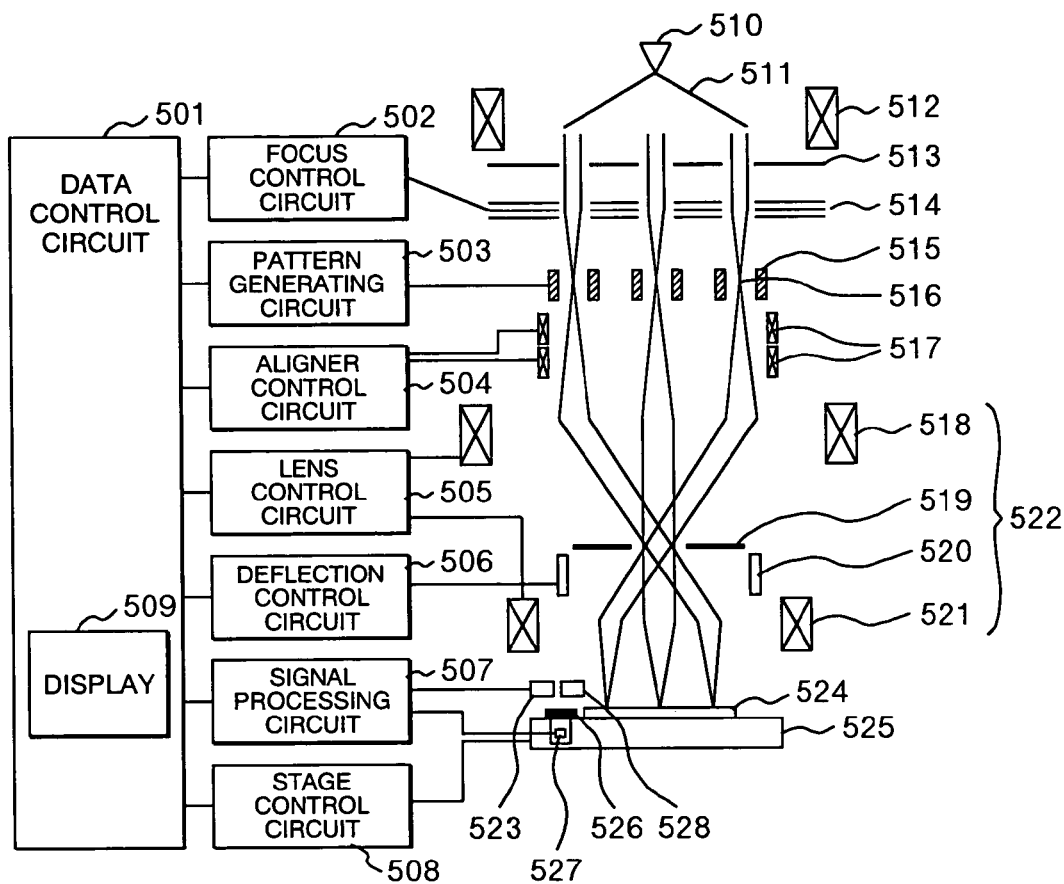
FIG. 5 is a schematic diagram of assistance in explaining the configuration of equipment according to Embodiment 3 of the present invention.

FIG. 5 shows the configuration of equipment according to this embodiment. In this embodiment, electron beam writing equipment of a multiple beam system is targeted. An electron beam 511 accelerated to 50 kV by an electron source 510 is a parallel beam through a condenser lens 512 to be isolated into a plurality of point beams by an aperture array 513 having a plurality of apertures. The point beams are imaged onto an intermediate image 516 of the point beams by a lens array 514 at the later stage. In order to on/off control the plurality of point beams individually, a blanker array 515 and a blanking aperture 519 are provided. The thus-produced multiple point beams are demagnified by a doublet lens 522 having a first projection lens 518 and a second projection lens 521 to be imaged onto a sample 524. There is a deflector 520 between the two lenses of the doublet lens, which defines the writing position on the sample 524.

There is a mark substrate 526 for position detection on a stage 525 mounting the sample 524. A laser interferometer, not shown, measuring the position of the stage 525 and a transmitted electron detector 527 are used to measure the position of the electron beam. The equipment has a reflected light detector 523 and a light source 528 in addition to the mark substrate 526 for position detection provided on the stage 525 and can measure the position of the light.

Aligners 517 having two stages are provided above the first projection lens 518 as the first lens of the doublet lens 522. They are engaged with each other to align the incident angle and the incident position of the electron beam onto the lens. The aligners 517 are driven by an aligner control circuit 504. The doublet lens 522 is driven by a lens control circuit 505. In this example, specifically, electric currents are supplied. The set values of the electric currents are determined by information provided from a data control circuit 501. A focus control circuit 502 and a pattern generator circuit 503 operate the corresponding optical elements by supplying voltages. The set values of these are determined by information provided from the data control circuit 501. The data control circuit 501 has a display 509 and performs calculation for determining the amount of operation of the lenses and aligners using information obtained from a signal processing circuit 507 and a stage control circuit 508.

Figure 6:
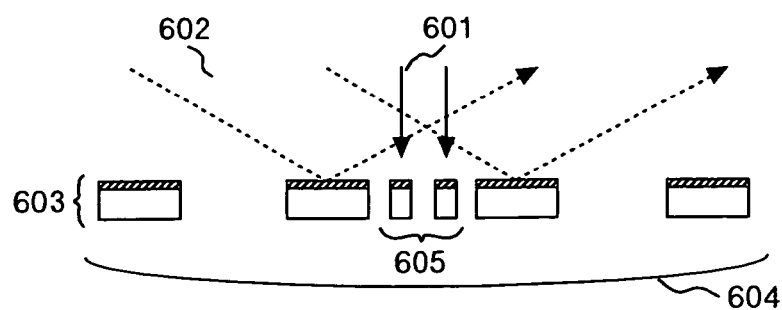
FIG. 6 is a diagram of assistance in explaining the cross-sectional structure of a mark substrate according to Embodiment 3.

In this embodiment, as another example in which the mark for electron beam is isolated from the mark for light beam, a substrate having a cross-sectional structure as shown in FIG. 6 is employed. The shape seen from the top is shown in FIG. 7. In FIG. 6, the light detecting surface, the light detector, the electron detecting surface and the electron detector are not shown. The basic structure is the same as those shown in FIGS. 2 and 4.

In this embodiment, a mark for electron beam 605 is positioned in a mark for light beam 604. Detection of light 602 may use reflected light from a large two-dimensional area for processing a reflected image by a CCD. An electron beam 601 is hard to use a backscattered electron from the large two-dimensional area since a usable electric current is significantly limited by the Coulomb effect and aberration. It is suitable to use a mark smaller than the mark for light beam. As in this embodiment, for the mark shape, the mark for electron beam 605 is included in the mark for light beam 604. While securing the respective detection accuracies, the stability of the relative distance between both marks can be ensured. In this case, when the signal of the reflected light is processed by avoiding a central mark area for electron beam 700 (area which has not been used for light measurement), interference of both can be prevented.

This equipment is used to detect the pattern position of the base layer to perform writing by the electron beam according to the obtained relative position information. As a result, an alignment accuracy of 23 nm can be realized by 3σ.

In the above embodiments, light is used as an energy beam for position detection and an electron beam in probe form is used as an energy beam for pattern forming. It is apparent that it can be applied to lithography equipment using other energy beams (e.g., projection type electron beam and ion beam, and short-wavelength light).

The invention claimed is:

1. Electron beam writing equipment comprising: an electron source; an electron optical system illuminating an electron beam emitted from said electron source onto a sample for scanning to form a desired pattern on said sample; a stage mounting said sample; a mark substrate provided on said stage; means beaming a light beam for position detection which is on the same side as the illumination direction of said electron beam for illuminating said mark substrate; light detection means which is on the same side as said means beaming a light beam for detecting reflected light reflected on said mark substrate; and electron detection means which is on the side opposite said light detection means with respect to said mark substrate for detecting a transmitted electron obtained by illumination of said electron beam onto said mark substrate, wherein relative position information of said light beam and said electron beam is obtained based on the signals of said detected reflected light and transmitted electron.

2. The electron beam writing equipment according to claim 1, wherein said mark substrate has a pattern in which a mark illuminating said electron beam is different from a mark illuminating said light beam.

3. The electron beam writing equipment according to claim 1, wherein in said mark substrate, the mark illuminating said electron beam is arranged in the mark illuminating said light beam.

4. The electron beam writing equipment according to claim 1, wherein said mark substrate has a support and apertures disposed in a predetermined pattern.

5. The electron beam writing equipment according to claim 4, wherein the support of said mark substrate is made of a light element, and the surface of said support at least on the side of said means beaming a light beam or the opposite side is coated by a metal.

6. The electron beam writing equipment according to claim 4, wherein the surface of the support of said mark substrate at least on the side of said means beaming a light beam or the opposite side is coated with a metal having a principal atom with an atomic number higher than that of a principal atom constituting said support.

7. The electron beam writing equipment according to claim 4, wherein the thickness of the support of said mark substrate is ½ or below of the range of an electron beam used for writing.

8. The electron beam writing equipment according to claim 4, wherein the principal atom constituting the support of said mark substrate is silicon, and the surface of said support at least on the side of said means beaming a light beam or the opposite side is coated with a heavy metal or noble metal.

9. The electron beam writing equipment according to claim 4, further comprising a member absorbing said light beam for position detection between said mark substrate and said electron detection means.

10. The electron beam writing equipment according to claim 2, wherein an aperture for transmitted electron in the position corresponding to a mark position illuminated by said electron beam and a light absorber in the position corresponding to a mark position illuminated by said light beam are provided on the opposite side of the illumination surface of said mark substrate.

11. The electron beam writing equipment according to claim 2, wherein said mark substrate has a support and apertures disposed in a predetermined pattern.

12. The electron beam writing equipment according to claim 3, wherein said mark substrate has a support and apertures disposed in a predetermined pattern.

13. The electron beam writing equipment according to claim 11, wherein the support of said mark substrate is made of a light element, and the surface of said support at least on the side of said means beaming a light beam or the opposite side is coated by a metal.

14. The electron beam writing equipment according to claim 12, wherein the support of said mark substrate is made of a light element, and the surface of said support at least on the side of said means beaming a light beam or the opposite side is coated by a metal.

15. The electron beam writing equipment according to claim 11, wherein the surface of the support of said mark substrate at least on the side of said means beaming a light beam or the opposite side is coated with a metal having a principal atom with an atomic number higher than that of a principal atom constituting said support.

16. The electron beam writing equipment according to claim 12, wherein the surface of the support of said mark substrate at least on the side of said means beaming a light beam or the opposite side is coated with a metal having a principal atom with an atomic number higher than that of a principal atom constituting said support.

17. The electron beam writing equipment according to claim 11, wherein the thickness of the support of said mark substrate is ½ or below of the range of an electron beam used for writing.

18. The electron beam writing equipment according to claim 12, wherein the thickness of the support of said mark substrate is ½ or below of the range of an electron beam used for writing.

19. The electron beam writing equipment according to claim 11, wherein the principal atom constituting the support of said mark substrate is silicon, and the surface of said support at least on the side of said means beaming a light beam or the opposite side is coated with a heavy metal or noble metal.

20. The electron beam writing equipment according to claim 12, wherein the principal atom constituting the support of said mark substrate is silicon, and the surface of said support at least on the side of said means beaming a light beam or the opposite side is coated with a heavy metal or noble metal.

21. The electron beam writing equipment according to claim 11, further comprising a member absorbing said light beam for position detection between said mark substrate and said electron detection means.

22. The electron beam writing equipment according to claim 12, further comprising a member absorbing said light beam for position detection between said mark substrate and said electron detection means.

23. Electron beam writing equipment comprising: an electron source; an electron optical system illuminating an electron beam emitted from said electron source onto a sample for scanning to write a desired pattern on said sample; a stage mounting said sample; a mark substrate provided on said stage; means beaming a light beam for position detection which is on the same side as the illumination direction of said electron beam for illuminating said mark substrate; light detection means which is on the same side as said means beaming a light beam for detecting reflected light reflected on said mark substrate; and electron detection means which is on the side opposite said light detection means with respect to said mark substrate for detecting a transmitted electron obtained by illumination of said electron beam onto said mark substrate, wherein relative position information of said light beam and said electron beam is obtained by using the signals of said detected reflected light and transmitted electron together.

24. Electron beam writing equipment comprising: an electron optical system independently on/off controlling each of a plurality of electron beams arrayed with a predetermined pitch, deflecting and scanning said on/off controlled electron beams together, and writing a desired pattern on said sample; a stage mounting said sample; a mark substrate provided on said stage; means beaming a light beam for position detection which is on the same side as the illumination direction of said electron beam for illuminating said mark substrate; light detection means which is on the same side as said means beaming a light beam for detecting reflected light reflected on said mark substrate; and electron detection means which is on the side opposite said light detection means with respect to said mark substrate for detecting a transmitted electron obtained by illumination of said electron beam onto said mark substrate, wherein relative position information of said light beam and said electron beam is obtained based on said detected reflected light and transmitted electron.

25. The electron beam writing equipment according to claim 24, wherein said mark substrate has a mark for light beam formed with a pattern having a pitch of substantially an integral multiple of a pitch of said plurality of electron beams.

26. The electron beam writing equipment according to claim 24, wherein the signals of said detected reflected light and transmitted electron are used together to perform baseline correction.

27. The electron beam writing equipment according to claim 25, wherein the signals of said detected reflected light and transmitted electron are used together to perform baseline correction.

28. An electron beam writing method comprising the steps of: illuminating and scanning an electron beam emitted from an electron source onto a sample mounted on a stage to form a desired pattern on said sample; illuminating a light beam for position detection onto a mark substrate provided on said stage from the same side as the illumination direction of said electron beam and detecting reflected light reflected on said mark substrate from the same side as the illumination direction of said light beam; illuminating said electron beam onto said mark substrate and detecting a transmitted electron which has transmitted though said mark substrate on the side opposite the side detecting said reflected light with respect to said mark substrate; and obtaining relative position information of said light beam and said electron beam based on said detected reflected light and transmitted electron, wherein a mark position on said sample is detected by said light beam to perform writing by said electron beam according to said obtained relative position information.

29. The electron beam writing method according to claim 28, wherein said mark substrate has a support and apertures disposed in a predetermined pattern.

30. The electron beam writing method according to claim 28, wherein said electron beams are multiple beams having a plurality of electron beams arrayed with a predetermined pitch, and said mark substrate is formed with a mark for light beam having a pattern of a pitch of substantially an integral multiple of the pitch of said multiple beams.

* * * * *